(12) United States Patent
Kottschlag et al.

(10) Patent No.: US 7,268,644 B2
(45) Date of Patent: Sep. 11, 2007

(54) ANTENNA CONNECTION DEVICE, ANTENNA SIGNAL SPLITTER AND METHOD FOR RECEPTION FREQUENCY CONTROL

(75) Inventors: Gerhard Kottschlag, Hildesheim (DE); Lutz Pochowski, Hildesheim (DE); Gerhard Pitz, Bayan Lepas Penang (MY)

(73) Assignee: Robert Bosch GmbH, Stuttgart (DE)

( * ) Notice: Subject to any disclaimer, the term of this patent is extended or adjusted under 35 U.S.C. 154(b) by 18 days.

(21) Appl. No.: 10/480,494

(22) PCT Filed: May 28, 2002

(86) PCT No.: PCT/DE02/01955

§ 371 (c)(1),
(2), (4) Date: Jul. 6, 2004

(87) PCT Pub. No.: WO03/005488

PCT Pub. Date: Jan. 16, 2003

(65) Prior Publication Data

US 2004/0239443 A1    Dec. 2, 2004

(30) Foreign Application Priority Data

Jun. 29, 2001  (DE)  ................. 101 31 457

(51) Int. Cl.
*H01P 5/12* (2006.01)
*H03H 7/46* (2006.01)

(52) U.S. Cl. ............... 333/126; 333/100; 333/129; 333/132

(58) Field of Classification Search ........... 333/126
See application file for complete search history.

(56) References Cited

U.S. PATENT DOCUMENTS 3,703,685 A  11/1972  Simopoulos et al.

(Continued)

FOREIGN PATENT DOCUMENTS

EP  0 567 766  11/1993

(Continued)

OTHER PUBLICATIONS

I. Yu Malevich, "A Low-Loss Splitter", Telecommunications and Radio Engineering, Begell House, Inc., New York, NY, US, Apr. 1, 1993, vol. 48, No. 4, pp. 30-31.

*Primary Examiner*—Robert Pascal
*Assistant Examiner*—Kimberly E Glenn
(74) *Attorney, Agent, or Firm*—Kenyon & Kenyon LLP

(57) ABSTRACT

A system for connecting at least two receivers to a common antenna is proposed, antenna signal lines being supplied to the receivers, which stands out in that the input impedances of the at least two receivers are matched only in a narrow-band fashion in the range of their current reception frequencies to the impedances of the antenna signal lines supplied to them. An antenna signal splitter is also proposed. Finally, a method for controlling the reception frequencies of at least two receivers connected to a common receiving antenna is proposed, which is distinguished by the fact that the reception frequencies of the at least two receivers are set in such a way that they maintain a predefined minimum frequency distance from one another. A reduction of an antenna signal attenuation in an antenna signal splitter for multiple receiver systems is thereby possible, provided the receivers are tuned to different reception frequencies.

2 Claims, 2 Drawing Sheets

U.S. PATENT DOCUMENTS

| | | | |
|---|---|---|---|
| 4,667,172 A * | 5/1987 | Longshore et al. | 333/134 |
| 5,689,219 A * | 11/1997 | Piirainen | 333/127 |
| 5,831,490 A * | 11/1998 | Sarkka et al. | 333/126 |
| 5,949,302 A * | 9/1999 | Sarkka | 333/126 |
| 6,005,453 A * | 12/1999 | Sarkka et al. | 333/126 |
| 6,018,644 A * | 1/2000 | Minarik | 455/82 |
| 6,140,888 A * | 10/2000 | Sarkka et al. | 333/126 |
| 6,683,512 B2 * | 1/2004 | Nakamata et al. | 333/126 |
| 6,812,809 B2 * | 11/2004 | Koukkari | 333/126 |
| 2001/0024145 A1 * | 9/2001 | Cullbom et al. | 333/17.1 |
| 2005/0219010 A1 * | 10/2005 | Erb | 333/126 |

FOREIGN PATENT DOCUMENTS

| | | |
|---|---|---|
| EP | 0 910 132 | 4/1999 |
| EP | 1 150 376 | 10/2001 |
| GB | 613927 | 12/1948 |
| WO | WO99/65743 | 12/1999 |
| WO | WO 01/95507 | 12/2001 |

* cited by examiner

ANTENNA CONNECTION DEVICE, ANTENNA SIGNAL SPLITTER AND METHOD FOR RECEPTION FREQUENCY CONTROL

FIELD OF THE INVENTION

The present invention relates to a device for connecting at least two receivers to a common antenna, an antenna signal splitter for connecting at least two receivers to a common receiving antenna, and a method for controlling the reception frequencies of at least two receivers connected to a common receiving antenna.

BACKGROUND INFORMATION

In a radio receiver, especially a broadcasting radio receiver, if several signals are to be evaluated simultaneously, e.g., broadcast signals of a broadcasting station broadcasting a music program, and additional broadcast signals of a further transmitter transmitting, for example, digitally coded traffic radio information, then the broadcast frequency mixture received by a receiving antenna, in which the broadcast frequencies of the stations of interest are also included, are split by an antenna signal splitter to the various receivers tuned to the broadcast frequencies of the stations that are of interest.

For this, an antenna signal splitter 120 such as that shown in FIG. 1 is often used, which is made up of a transformer 121 having several windings and a center tap for supplying the antenna signal of receiving antenna 100 and of terminals 125, 126 for coupling out the split antenna signals by the connected receivers and over and above that, resistors 122 shunting the output connectors. By the suitable choice of the resistance value of the resistor(s) 122, namely, for example, in the case of a splitter having two outputs, ideally twice the input impedance of the receiving series, connected to output terminals 125, 126 of splitter 120, which ideally corresponds to the impedance of the antenna signal line, a bidirectional matching of the antenna signal splitter outputs 125 and 126 to the impedance of the system or the respective receiver is achieved. An additional input transformer 123 matches the impedance of antenna 100 or the antenna line to the input impedance of splitting transformer 121.

This circuit is usable in a broadband manner and insensitive to mismatch at individual antenna signal splitter outputs 125, 126. The disadvantage is the attenuation acting in the entire usable frequency range, which of necessity is created by the broadband signal splitting.

Great Britain Patent No. 613927 describes a receiver system having at least two receivers. The receivers are connected to a common antenna via antennal signal lines. Each of the receivers has available a fixed prefilter having bandpass characteristics, so that it has an impedance matching to the antenna signal lines, supplied to them, only in the range of their pass bands lying in different frequency ranges. Each of the receivers is limited to a certain working frequency or a certain narrow working frequency range, in which, as a result of the narrow bandwidths of the prefilters, it has available to it a maximum antenna signal power. Outside the working frequency range, as a result of the narrow bandwidths of the prefilters, practically a total reflection of the antenna signal is present. It is thereby achieved that the antenna signal is available almost loss free to each of the receivers in the frequency range utilized by it.

SUMMARY

In accordance with an example embodiment of the present invention, at least two receivers are connected to a common antenna. In each case, approximately the total receiving energy of the respective reception frequency is available to the individual connected receivers, provided that the receivers are tuned to different reception frequencies.

According to the example embodiment of the present invention, the input impedances of the at least two receivers are matched only in a narrow-band fashion in the range of their current reception frequencies to the impedances of the antenna signal lines supplied to them. In addition, the antenna signal lines are connected to each other in a high-impedance manner, the high-impedance connection in the ideal case having an infinite resistance or a resistance tending to infinity, so that this may also be omitted.

Such a development of the present invention has the effect that each receiver has an input impedance, only for its specific reception frequency and closely adjacent frequencies, which corresponds to the splitter output impedance and the impedance of the antenna signal supply lines, and, as a result of the impedance matching achieved thereby, is optimized for a signal transmission from the splitter to the receivers. For all other frequencies which do not match the reception frequencies of the receivers and these closely adjacent frequencies, the respective input impedance of the receivers sharply deviates from the splitter output impedance, which causes a signal reflection at the inputs of the receivers.

In antenna signal splitters according to the related art, the reflected energy at the inputs of the receivers is absorbed in the terminating impedances 122.

If, on the other hand, the terminating impedance(s) according to the present invention is/are developed to be high-impedance, or drop out altogether, the signal components reflected at the receivers are guided back into the splitter transformer and consequently reach the respective other splitter outputs. Provided that the receivers connected to the splitter outputs are tuned to different reception frequencies, each of the connected receivers thus receives almost the entire receiving energy of the respective frequency to which it is tuned, since the reflected signals of the other outputs can only be taken up in an impedance-matched receiver and coupled out of the system. The antenna signal splitter according to the present invention and the device according to the present invention consequently make possible a smaller signal attenuation in a radio frequency of interest by signal partition using the antenna signal splitter.

The example method according to the present invention for controlling the reception frequencies of at least two receivers connected to a common receiving antenna may make possible a constantly optimal signal partition of the antenna signals to the individual receivers in such a way that each receiver receives the antenna signal in the range of its current reception frequency at the least possible signal attenuation. Ideally, each receiver obtains the antenna signal unattenuated in the range of its reception frequency.

According to the present invention, this is achieved by setting the reception frequencies of the at least two receivers in such a way that they maintain a predefined minimum frequency distance from each other. The minimum frequency distance is predefined, in this context, by the bandwidth within which the receivers have an input impedance matching to the antenna signal lines supplied to them.

The example control method according to the present invention is based on the recognition mentioned at the beginning, that at each respective receiver a maximum receiver signal power is only present for the frequency in question when the two receiving series are tuned to reception frequencies that are different from each other, so that the antenna signal for a respectively observed reception frequency is coupled out of the system only by one of the receivers, but is reflected by the remaining receivers. This can only be made real when, with regard to a certain reception frequency that is of interest, only a single receiver demonstrates an input impedance matching, but the remaining receivers have an input impedance mismatch.

A further development of the example method according to the present invention is directed at the idea that, in response to a degradation of the quality of reception of radio frequency, received with the aid of a first of the at least two receivers, to below a predefined value, and for the case that the additional reception frequency of the at least one additional receiver does not demonstrate a predefined minimum frequency distance from the reception frequency of the first receiver, the additional reception frequency of the at least one additional receiver is set in such a way that it maintains a predefined minimum frequency distance from the reception frequency of the first receiver.

According to that, it is entirely allowable to set the same reception frequency on several receivers of the multi-receiver system, and thus to permit a coupling out of the antenna signal for the same reception frequency, with the aid of several receivers, from the system and to permit the signal attenuation connected with that, as long as the received broadcast radio frequency is able to be received having sufficient reception quality. If the reception quality of the broadcast frequency set in the same way on all receivers is, or deteriorates to, below a predefined value, a quality improvement may possibly be achieved by increasing the receiving signal power for the broadcast frequency being observed. In the method described, this may be achieved by letting only one receiver remain tuned to the observed broadcast frequency, whereas the receiver, or the remaining receivers are tuned to other frequencies, so that the latter have an input impedance mismatch with respect to the originally observed frequency. Then the entire receiving signal energy at the observed frequency is available to the first receiver, which remains set to the observed broascast frequency.

BRIEF DESCRIPTION OF THE DRAWINGS

Exemplary embodiments of the present invention are illustrated in the drawings and explained in detail below.

DETAILED DESCRIPTION OF EXAMPLE EMBODIMENTS

The present invention may be especially suitable for use in a mobile broadcast receiver, such as an auto radio unit developed for reception frequency-modulated ultrashort wave (UKW) broadcast signals. Therefore, the present invention is described in the following text using the example of an auto radio, without the limitation of generality and without excluding additional possible application cases, such as for other kinds of radio or broadcast receivers, radio units or the like.

Figure 2:
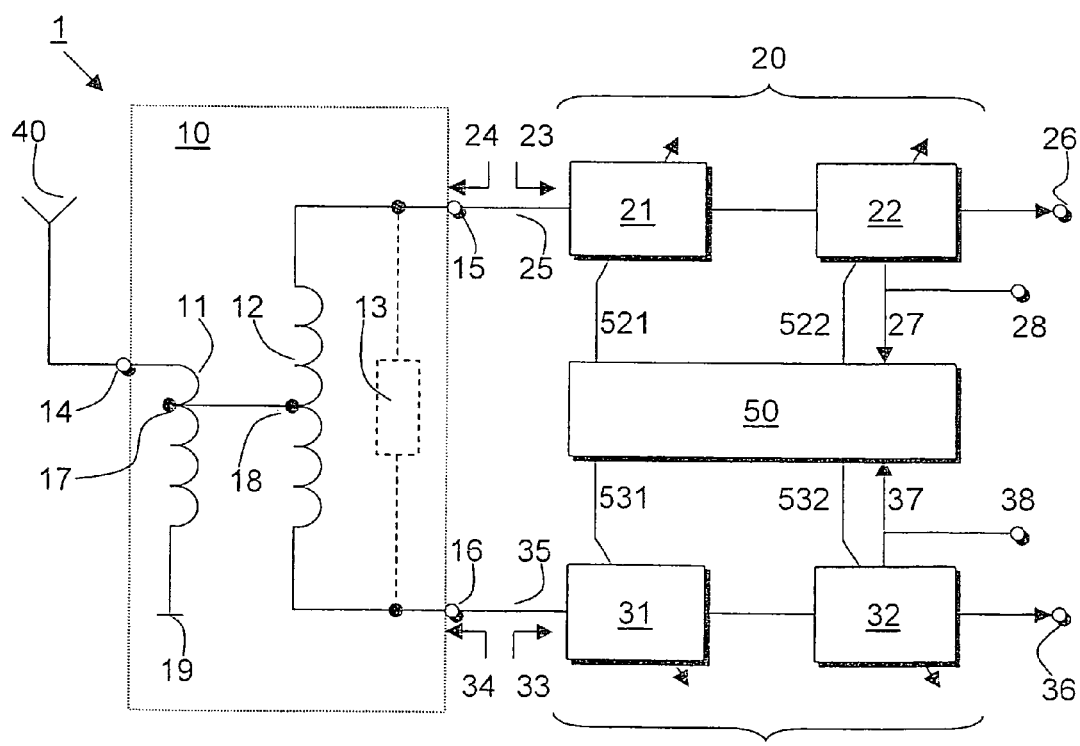
FIG. 2 shows a block diagram of an example system according to the present invention for using in a mobile broadcast receiver, especially an auto radio.

The broadcast frequency mixture present at receiving antenna 40 of the example device according to the present invention, shown in FIG. 2, which is made up of a superimposition of the broadcast frequencies receivable at the receiver site—generally in densely populated areas, as in Europe, on account of the available transmitter landscape, at nearly every receiver site a plurality of broadcast frequencies can be received—is supplied to an input 14 of an antenna signal splitter 10. This has a transformer 12 having a plurality of windings. The antenna signal is supplied to a center tap 18 of transformer 12. An additional input transformer 11 is provided for the matching of the impedance of antenna 40 or the antenna line to the input impedance of splitting transformer 12. From a tap 17 of input transformer 11, which is connected on one side to antenna 40 and at its opposite terminal to a reference potential 19, the impedance-matched antenna signal is supplied to center tap 18 of splitting transformer 12. The respective end terminals of splitting transformer 12 form a first signal output 15 of antenna signal splitter 10 and at least one second signal output 16 of splitter 10. Splitter 10 further includes a high-impedance-developed ohmic electrical resistor 13 which connects signal outputs 15 and 16 of antenna signal splitter 10 to each other. According to the present invention, the value of ohmic resistor (13) is higher, at least by one order of magnitude, than the antenna impedance or rather, the output impedance of signal outputs 15 and 16 of antenna signal splitter 10. According to one further improvement of the present invention, the value of ohmic resistor 13 may be increased to be so high that it may be completely omitted.

In the case of the exemplary embodiment of the present invention shown in FIG. 2, splitter 10 has two signal outputs 15 and 16. At first signal output 15 of splitter 10, the split antenna signal is supplied to a first receiver 20, via a first antenna signal line 25.

First receiver 20 includes a first controllable prefilter 21 which makes possible a narrow-band impedance matching of input impedance 23 of first receiver 20 to line impedance 24 of first antenna signal line 25. First receiver 20 also includes a first receiving element 22, to which the antenna signal prefiltered by first prefilter 21 is supplied. In first receiving element 22, the antenna signal is down-converted by mixing with a suitably selected first combination frequency into an intermediate frequency plane, in the case of the presently observed UKW FM broadcast receiver at 10.7 MHz—divergent intermediate frequencies, such as 24.9375 MHz, depending on the particular application, may also be useful. The combination frequency for converting the entering antenna signal into the intermediate frequency plane is determined according to a first tuning control signal 522 made available by a control unit 50. The tuning of first receiver 20 to a certain reception frequency thus takes place by an appropriate selection of the combination frequency according to a corresponding first tuning control signal 522.

At the output of first receiving element 22, the signal at combination frequency is available at an output 26 for further processing, which is here not of any further interest. At another output of first receiving element 22, a first quality signal 27 may be tapped off which indicates the receiving quality of the received broadcast signal, and the received broadcast frequency. This may indicate, for example, the receiving signal field strength of the received broadcast frequency. Moreover it may be provided that, with the aid of further signal processing 26, additional quality auxiliary signals, which indicate the receiving quality of the received broadcast frequency, are derived, which may flow into quality signal 27. These additional quality auxiliary signals are symbolized in the figure by source 28.

Besides first tuning control signal 522, control unit 50 produces a prefilter control signal 521 for controlling first prefilter 21 in such a way that an ideal impedance matching of narrow-band input impedance 23 of first prefilter 21 to antenna signal line impedance 24 is present in each case in the range of the reception frequency set with the aid of tuning control signal 522.

A second receiver 30 is connected to second signal output 16 of splitter 10 via a second antenna signal line 35, which includes a second controllable prefilter 31, which is controlled according to a second prefilter control signal 531, and a second receiving element 32, which is controlled by control unit 50 according to a second tuning control signal 532. The intermediate frequency signal which is able to be tapped at the output of second receiving element 33 may be tapped at a second output 36, and is here, too, supplied to further processing. Comparable to the first receiving series, second receiving element 32 also sends a second quality signal 37, which indicates the receiving quality of the received broadcast frequency, to control unit 50 which may be supplemented by information from the further processing unit, represented here by source 38.

Figure 3:
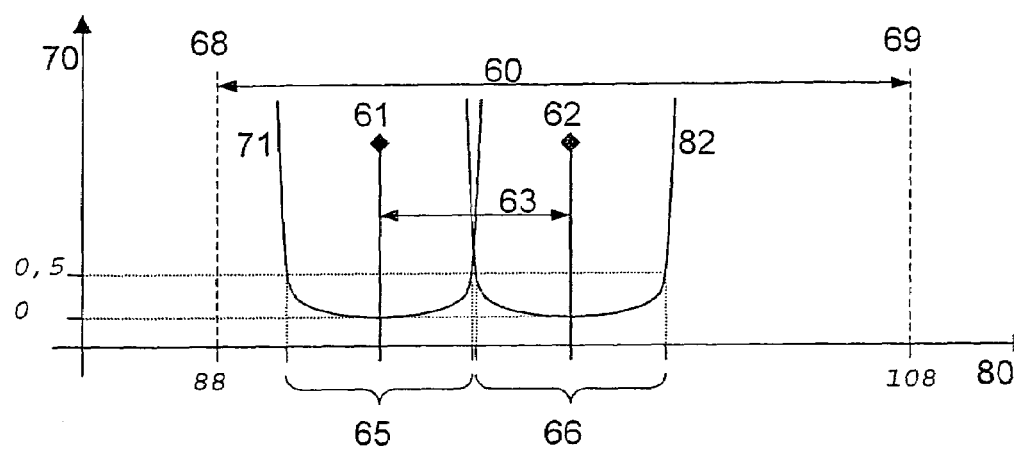
FIG. 3 shows the pattern of the signal reflection as a result of the mismatch, plotted against the broadcast frequency.

FIG. 3 shows patterns 71, 82 of the impedance matching of prefilters 21 and 31 as a function of the respectively set reception frequencies 61 and 62 of each receiver 20, 30 plotted against reception frequency 80.

Bandwidths 65 and 66 of prefilters 21 and 31 represent the sections of the frequency patterns, shown in curves 71 and 82, within which an impedance matching of prefilter input impedances 23 and 33, and thus the receiving input impedances takes place. These are given in the figure by the 3 dB frequency limit.

Since the aim of the present invention is to achieve an antenna signal splitting having as low as possible an attenuation for both the at least two connected receivers, the 3 dB frequency limit, usually used for the characterization of filters, may already be regarded as being associated with too strong a signal attenuation. For this case, the definition of a divergent frequency limit may be advisable, e.g., of a 1 dB frequency limit and a corresponding 1 dB bandwidth, within which an impedance matching is present.

The 3 dB bandwidths of curves 71 and 82 shown in FIG. 3 each come out to about 5 MHz in the present exemplary embodiment. If a 1 dB bandwidth is specified, it turns out correspondingly narrower.

If, for example, a first reception frequency 61 is set on first receiving element 22 with the aid of first tuning control signal 522, first prefilter 21, with the aid of first prefilter control signal 521, is made to follow in such a way that input impedance 23 of first prefilter 21 with respect to receiver 20 is matched, in the sense of an impedance matching, in the best possible way to impedance 24 of antenna signal line 25 supplied to it. This means that curve 71 in FIG. 3 is made to follow this reception frequency as a function of a reception frequency 61 set on first receiving element 22, so that reception frequency 61 always gets to lie in the middle of curve 71, in the illustration, that is, at an attenuation minimum. That means that, for the particularly set reception frequency 61, at any point in time there is present an ideal impedance matching of input impedance 23 of prefilter 21, so that for the reception frequency 61 set, a maximum of antenna signal power is able to be coupled out of splitter 10.

As shown in FIG. 3, there takes place also, for second receiver 30, by suitable control of second prefilter 31, in an analogous fashion, an impedance matching of input impedance 33 of second prefilter 31 to impedance 34 of antenna signal line 35, as a function of second reception frequency 62 set on second receiving element 32. The reflection of the antenna signal, present at the second signal output, of the splitter 10, at second prefilter 31, may be read off on curve 82 in FIG. 3, just as was, on corresponding curve 71, the antenna signal present at first output 15 of antenna signal splitter 10.

Figure 1:
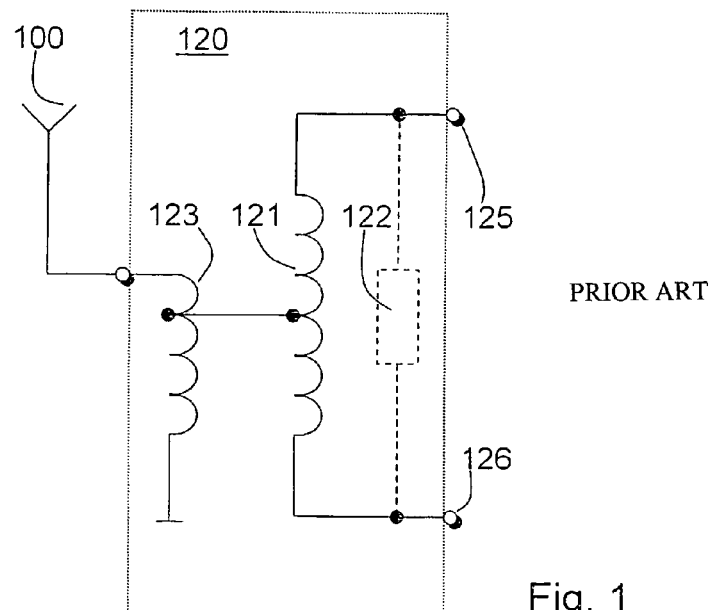
FIG. 1 shows a block diagram of an antenna signal splitter according to the described related art.

In the case of an FM UKW broadcast receiver provided for operation in European space, the broadcast frequency band 60, that is of interest, lies between a lower band limit 68 of 87.5 MHz and an upper band limit 69 at 108.0 MHz. In order to make possible the effect, described above, of a maximum signal decoupling in each case of a broadcast frequency of interest from antenna signal splitter 10, it is necessary that, for the two frequencies 61 and 62 that are of interest, respectively only one of the two receivers 20 and 30 has an input impedance matching, while each of the two receivers 20 and 30 must have an input impedance mismatch for the respective other of the two frequencies 61 and 62. According to the present invention, this can be achieved by tuning the at least two receivers 20, 30 of device 1 to different reception frequencies 61 and 62, which have a minimum frequency distance 63 from each other which follows from the bandwidth within which prefilters 21 and 31 have an input impedance matching. In the exemplary embodiment shown in FIG. 3, bandwidths 65 and 66 of first and second prefilters 21 and 31 are respectively defined as the frequency range within which the measure of reflection of an antenna signal at the respective prestage lies below an established factor, in the example of the FIG. 1/2 (corresponding to 3 dB). Thus, according to the present invention, the two reception frequencies 61 and 62, which are set on first receiving element 22 and second receiving element 32, are spaced apart from each other by the minimum frequency spacing $$\Delta f_{min} = \frac{1}{2} \times (B_1 + B_2),$$

where

B1 is bandwidth 65 of first prefilter 21 and

B2 is bandwidth 66 of second prefilter 31.

In the case of first bandwidth 65 being equal to second bandwidth 66, the two reception frequencies are spaced apart by bandwidth 65 or 66 of prefilter 21 or 31, respectively. The bandwidth 65 and 66 of the first and the second prefilter may, in this context, as shown in the figure, be defined by the 3 dB frequency limits, but alternatively to that, also preferably by divergent frequency limits, in the case of which a lower signal attenuation is present.

According to one advantageous further development of the present invention, it may additionally be provided that broadcast frequencies 61 and 62 that are closer together and possibly further frequencies are also permitted, as long as these are able to be received at sufficient receiving quality using the correspondingly assigned receiving elements. If, on the other hand, at least one of the reception frequencies of interest is received at insufficient, or no longer sufficient reception quality, which control unit 50 determines in the light of quality signals 27 and 37 supplied to it, it is provided according to the present invention that the additional receiving element(s) 30, as well as the respectively assigned prefilters 31 are detuned to such an extent that the reception frequency 62, or reception frequencies set on them, maintain the predefined minimum frequency separation to first broadcast frequency 61 that is no longer received at sufficient receiving quality. By this detuning of additional receiving element 32 or of further receiving elements, it is achieved that only, still, for first receiver 20, on which disturbed reception frequency 61 is set, an impedance matching in the range of disturbed reception frequency 61, that is of interest, is present, so that this is now exclusively decoupled from antenna signal splitter 10 by first receiver 20. Consequently, for this first reception frequency 61, a reduced attenuation comes about, since the antenna signal power at reception frequency 61, that is of interest, is available for only a single receiving element, namely first receiving element 22.

Consequently, there is the possibility that first broadcast frequency 61, which was previously no longer adequately receivable, can once again be received at sufficient reception quality as a result of an increased available receiving signal power for first receiving element 22.

Comparable considerations are also, of course, true in reverse in the same sense for second or additional reception frequencies.

What is claimed is:

1. A method for controlling receivers connected to a common antenna, each of the receivers having a respective allocated prefilter with a band filter characteristic, each of the receivers being set to a different reception frequency, the method comprising: controlling a position of each passband of each of the prefilters so that each of the set reception frequencies lies respectively in the passband of the prefilter allocated to the respective receiver; wherein, in response to a degradation of a quality of reception of a radio frequency, received using a first one of the receivers, to below a predefined value, and when the reception frequency of at least another one of the receivers does not demonstrate a predefined minimum frequency distance from the reception frequency of the first one of the receivers, the reception frequency of the at least another one of the receivers is set in such a way that it maintains a predefined minimum frequency distance from the reception frequency of the first one of the receivers.

2. The method as recited in claim 1, wherein the minimum frequency distance is predefined by the bandwidth within which the receivers have an input impedance matching to the antenna signal lines supplied to them.

* * * * *